(12) United States Patent
Diem et al.

(10) Patent No.: US 7,830,027 B2
(45) Date of Patent: Nov. 9, 2010

(54) LEVEL REALIGNMENT FOLLOWING AN EPITAXY STEP

(75) Inventors: Bernard Diem, Echirolles (FR); Eugene Blanchet, Saint Egreve (FR); Bishnu Gogoi, Scottsdale, AZ (US)

(73) Assignees: Commissariat a l'Energie Atomique, Paris (FR); Freescale Semiconductor, Inc., Austin, TX (US)

( * ) Notice: Subject to any disclaimer, the term of this patent is extended or adjusted under 35 U.S.C. 154(b) by 617 days.

(21) Appl. No.: 11/578,975

(22) PCT Filed: Apr. 20, 2005

(86) PCT No.: PCT/FR2005/050260

§ 371 (c)(1),
(2), (4) Date: Oct. 18, 2006

(87) PCT Pub. No.: WO2005/106943

PCT Pub. Date: Nov. 10, 2005

(65) Prior Publication Data

US 2007/0221120 A1    Sep. 27, 2007

(30) Foreign Application Priority Data

Apr. 21, 2004    (FR)    .................... 04 50752

(51) Int. Cl.
C30B 25/12 (2006.01)
C30B 25/14 (2006.01)
H01L 23/544 (2006.01)
H01L 23/52 (2006.01)

(52) U.S. Cl. .................... 257/797; 117/84; 117/89; 117/90; 117/94; 117/95; 117/97; 117/101; 117/105; 257/758; 257/765

(58) Field of Classification Search .................. 117/84, 117/89, 90, 95, 97; 438/401, 462, 975; 148/DIG. 102; 257/797, 758, 765; 356/399, 4.1
See application file for complete search history.

(56) References Cited

U.S. PATENT DOCUMENTS 4,936,930 A * 6/1990 Gruber et al. .............. 148/33.2

(Continued)

FOREIGN PATENT DOCUMENTS

EP    0 961 320 A2    12/1999

(Continued)

OTHER PUBLICATIONS

Ian Black "ASM Stepper Alignment Through Thick Expitaxial Silicon Films", SPIE, vol. 3741, May 1999, pp. 23-33, XP-002319008.

*Primary Examiner*—G. Nagesh Rao
(74) *Attorney, Agent, or Firm*—Oblon, Spivak, McClelland, Maier & Neustadt, L.L.P.

(57) ABSTRACT

The invention relates to inter-level realignment after a stage of epitaxy on a face (31) of a substrate (30), comprising the production of at least one initial guide mark (32) on the face of the substrate, this initial guide mark being designed so as to be transferred, during epitaxy, onto the surface of the epitaxied layer (36). The initial guide mark (32) is produced in such a way that, during epitaxy, its edges create growth defects that propagate as far as the surface of the epitaxied layer (36) to provide a transferred guide mark (37) on the surface of the epitaxied layer (36) reproducing the shape of the initial guide mark (32) and in alignment with the initial guide mark.

13 Claims, 3 Drawing Sheets

U.S. PATENT DOCUMENTS

| | | | |
|---|---|---|---|
| 5,128,280 A * | 7/1992 | Matsumoto et al. | 438/504 |
| 5,270,255 A * | 12/1993 | Wong | 438/643 |
| 5,283,205 A * | 2/1994 | Sakamoto | 438/694 |
| 5,314,837 A * | 5/1994 | Barber et al. | 438/504 |
| 5,405,810 A * | 4/1995 | Mizuno et al. | 438/16 |
| 5,500,392 A * | 3/1996 | Reynolds et al. | 438/401 |
| 5,700,732 A * | 12/1997 | Jost et al. | 438/401 |
| 5,792,122 A * | 8/1998 | Brimhall et al. | 604/263 |
| 5,798,292 A * | 8/1998 | Jost et al. | 438/401 |
| 5,801,090 A * | 9/1998 | Wu et al. | 438/622 |
| 5,925,937 A * | 7/1999 | Jost et al. | 257/797 |
| 6,046,094 A * | 4/2000 | Jost et al. | 438/401 |
| 6,137,186 A * | 10/2000 | Jost et al. | 257/797 |
| 6,207,529 B1 * | 3/2001 | Jost et al. | 438/401 |
| 6,358,814 B1 * | 3/2002 | Harada | 438/401 |
| 6,596,604 B1 * | 7/2003 | Lojek et al. | 438/401 |
| 6,605,516 B2 * | 8/2003 | Jost et al. | 438/401 |
| 7,396,407 B2 * | 7/2008 | Saenger et al. | 117/63 |
| 2006/0099781 A1 * | 5/2006 | Beaumont et al. | 438/509 |
| 2006/0208257 A1 * | 9/2006 | Branz et al. | 257/49 |
| 2006/0255331 A1 * | 11/2006 | Chen et al. | 257/19 |
| 2007/0221120 A1 * | 9/2007 | Diem et al. | 117/84 |

FOREIGN PATENT DOCUMENTS

| | | |
|---|---|---|
| JP | 63108717 | 5/1988 |
| JP | 07-153669 | 6/1995 |
| JP | 10312964 | 11/1998 |

\* cited by examiner

US 7,830,027 B2

LEVEL REALIGNMENT FOLLOWING AN EPITAXY STEP

CROSS-REFERENCE RELATED APPLICATIONS:

11/578,975 is a national stage entry of PCT/FR05/50260 filed Apr. 20, 2005.

TECHNICAL FIELD

The invention relates to a method enabling realignment between levels after a stage of epitaxy on a substrate. The invention also relates to a substrate having at least one guide mark enabling this realignment.

In particular, it concerns the production of epitaxies of semiconducting material.

STATE OF PRIOR ART

Epitaxy is a crystalline growth of a material, generally produced on the same material, respecting the crystalline lattice and orientations. Realignment of levels after a stage of thick epitaxy on silicon is very important for applications in microelectronics and in micro-systems. One often needs to carry out certain technological operations (also called photolithographic levels) on the silicon substrate base (solid substrate or SOI), before a thick epitaxy. These levels are very precisely aligned (within less than a micrometer) relative to each other because of the very small dimensions of the patterns. After a stage of thick epitaxy (several tens of micrometers), it is necessary to continue the technological process with supplementary layers which must be perfectly aligned on the pre-epitaxial layers. The thicker the epitaxy, the more difficult the realignment.

On of the realignment techniques known to those skilled in the art is to use guide marks on the rear face of the substrate, these guide marks being aligned with the levels of the front face (active) using specific equipment (double face aligner). Because the epitaxy deposited on the front face does not damage this guide mark, it can be re-used as reference for the post-epitaxy levels.

FIG. 1 illustrates this technique. It is a transversal cross-section showing a semiconductor substrate 1, for example silicon. It can be a solid substrate or an SOI substrate. The substrate 1 is provided with guide marks 2 on its front face (the face on which the epitaxy is carried out) and with guide marks 3 on its rear face. The epitaxied layer 4 hides the guide marks 2 of the front face of the substrate 1, which therefore have no further use. On the other hand, the guide marks 3 on the rear face of the substrate 1 can be used again.

The main disadvantages of this technique are:
the necessity of using a polished substrate on the rear face as well (to define the guide marks), which leads to a non-standard substrate that is therefore more expensive.
the necessity of using specific equipment to create this rear face guide mark and to re-read it after epitaxy.
alignment precision between the rear face guide marks and the front face levels is limited (several micrometers in general) this precision depends on the thickness of the substrate.

A second technique consists of using the mechanical pre-alignment function of standard equipment (called "steppers") which make it possible to position the substrate in a relatively precise manner without any reference on the substrate.

This second technique is illustrated in FIG. 2, which shows a semiconductor substrate 10 seen from above. The substrate 10 is provided with a mechanical guide mark represented by 11 in FIG. 2. This mechanical guide mark can be a flat face produced on the side of the substrate or a notch. Nonetheless, the obtained alignment precision remains limited to several micrometers in the best of cases.

Another technique consists of producing, on the front face of the substrate, a mark or reference in the substrate material (or in a material deposited on this substrate) which, after the production of epitaxy, will be transferred onto the surface of the epitaxied layer.

FIG. 3 illustrates this technique. It is a view in transversal cross-section showing a semiconductor substrate 20, for example a solid substrate of silicon or an SOI substrate. Guide marks 21 have been made in the upper layer of the substrate 20. These guide marks are constituted, for example, by engraving an imprint in the substrate or by engraving a layer deposited on this substrate. A layer 22 is deposited by epitaxy on the front face of the substrate 20. The epitaxy transfers the initial guide marks and the front face of the epitaxied layer 22 is then provided with new guide marks. However, these reproduced guide marks 23 are deformed and shifted relative to the initial guide marks 21, as shown in FIG. 3. This deformation and shift make later recognition and thus precise alignment difficult.

DESCRIPTION OF THE INVENTION

Intrinsically, the technique of transferring a guide mark is the most interesting (standard equipment and substrate) and potentially the most precise (work on the same face and optical recognition).

The present invention therefore proposes a technique for realignment between levels, using a guide mark on the front face of the substrate, this mark being reproduced after epitaxy with very good quality and without any shift.

The aim of the invention is thus a method enabling realignment between levels after a stage of epitaxy on a face of a substrate, comprising the production of at least one initial guide mark on said substrate face, this initial guide mark being designed so as to be transferred, during epitaxy, onto the surface of the epitaxied layer, the method being characterised in that the initial guide mark is produced in such a way that, during epitaxy, its edges create growth defects that propagate as far as the surface of the epitaxied layer to provide, on the surface of the epitaxied layer, a transferred guide mark reproducing the shape of the initial guide mark and in alignment with the initial guide mark.

Advantageously, the production of the initial guide mark can include the formation of a plate comprising a stack of at least one layer of material that does not allow development of epitaxy, formed on the face of the substrate, and of a layer of material allowing development of epitaxy. This plate can be formed by stages of deposit and engraving of layers. The layer of material not allowing development of epitaxy can be a layer of a dielectric material.

Said substrate face can be a face allowing epitaxy of a semiconductor material. It can also be a semiconductor material.

According to a special application, said substrate face is in monocrystalline silicon, the layer of material of the initial guide mark allowing development of epitaxy being in polycrystalline silicon, the edges of the guide mark being aligned with the crystalline axes of the monocrystalline silicon of the substrate. In order to obtain the material not allowing development of epitaxy, the formation of the plate can thus comprise the formation of a silicon oxide layer and/or the formation of a layer of silicon nitride.

A further aim of the invention is a substrate intended for producing epitaxy on one of its faces, comprising at least one initial guide mark designed to obtain, after the epitaxy stage, a guide mark transferred onto the surface of the epitaxied layer, characterised in that the initial guide mark has edges able to create, during epitaxy, growth defects that propagate as far as the surface of the epitaxied layer to provide, on the epitaxied layer surface, the transferred guide mark which reproduces the shape of the initial guide mark and is in alignment with the initial guide mark.

Advantageously, the initial guide mark can comprise a stack including at least one layer of material preventing development of epitaxy, formed on the substrate face, and a layer of a material allowing development of epitaxy.

SHORT DESCRIPTION OF THE DRAWINGS

The invention will be better understood and other advantages and particularities will become clear by reading the following description, given as a non-limiting example, accompanied by the attached drawings among which:

FIG. 1, already described above, shows a transversal cross-section of a semiconductor substrate on which an epitaxy has been carried out according to prior art;

FIG. 2, already described above, is a view from above of a semiconductor substrate provided with a mechanical guide mark on its front face according to prior art;

FIG. 3, already described above, shows a transversal cross-section of a semiconductor substrate on which an epitaxy has been carried out according to prior art;

DESCRIPTION OF A SPECIAL EMBODIMENT OF THE INVENTION

The following part of the description refers, as a non-limiting example, to the case of a substrate with a silicon face intended to support a silicon epitaxy.

Figure 1:
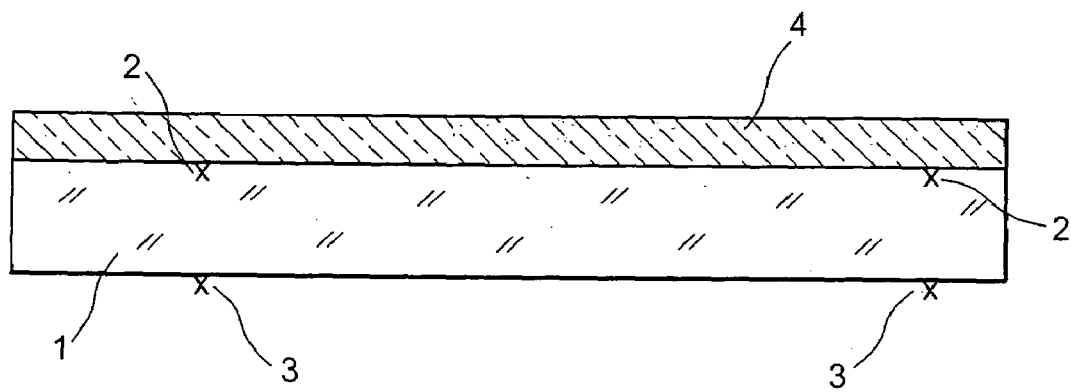
Figure 2:
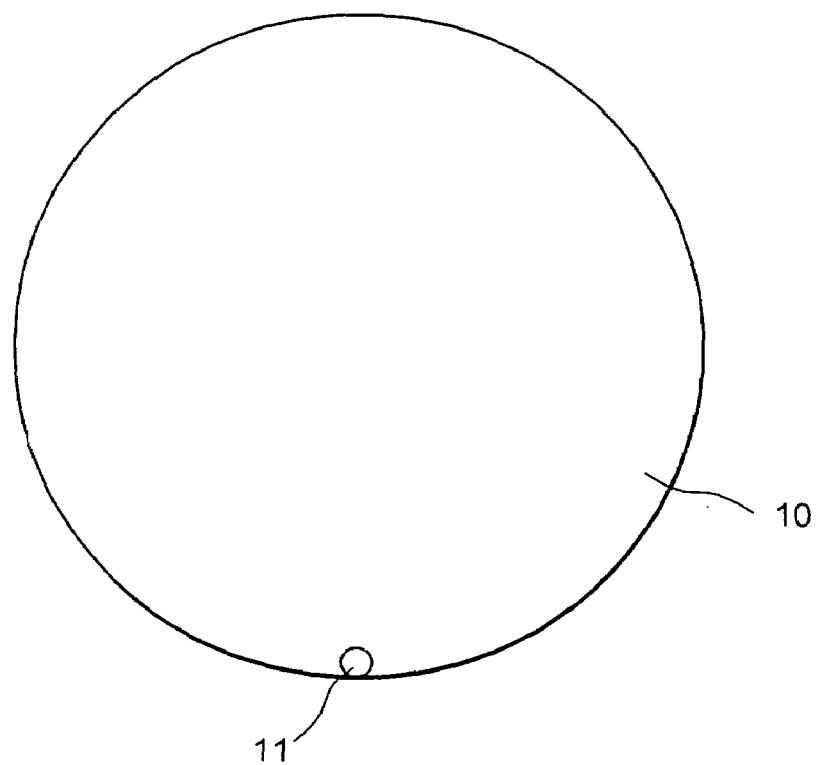
Figure 3:
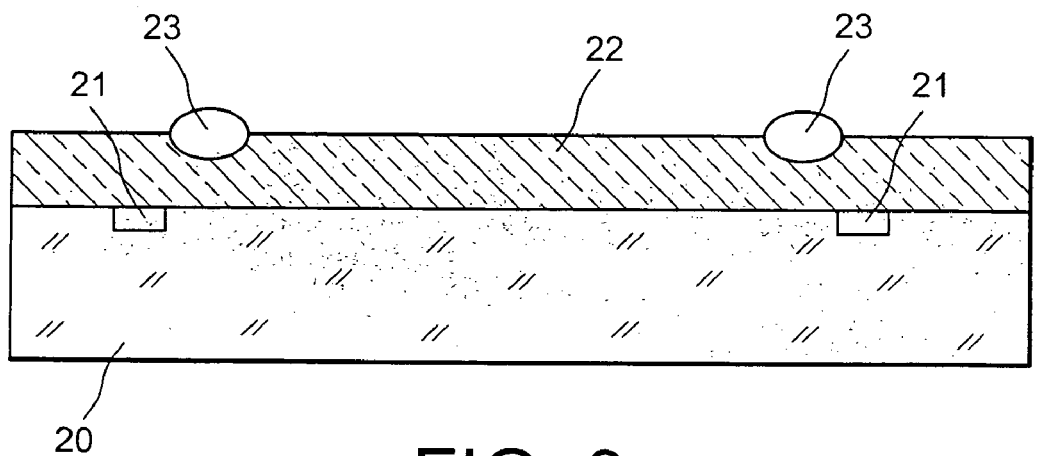
Figure 4:
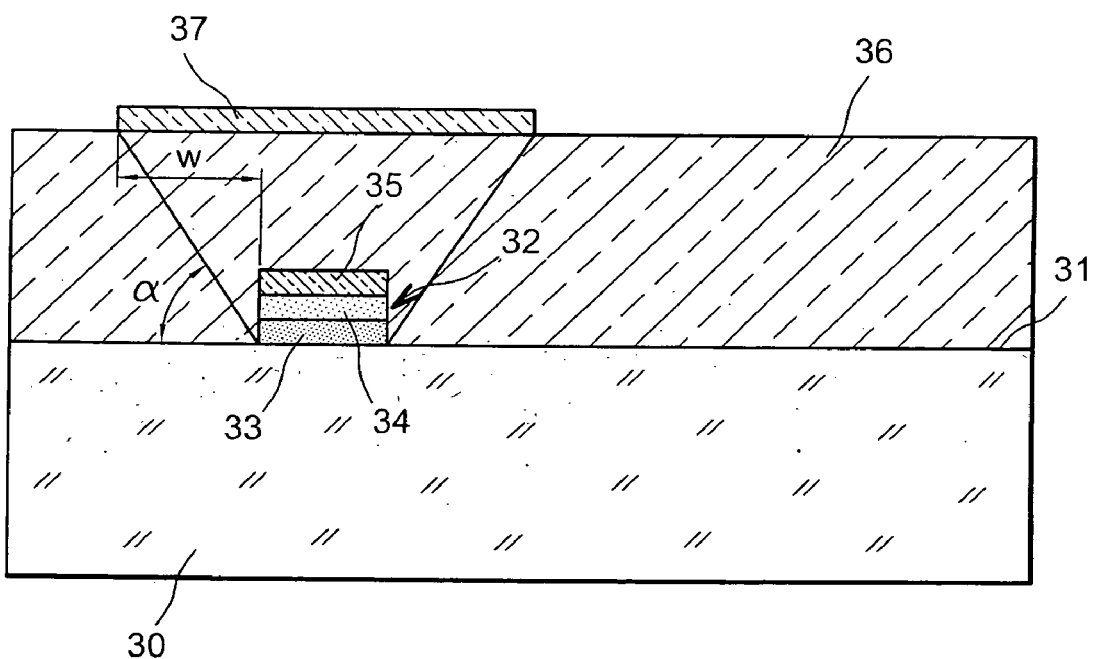
FIG. 4 shows a transversal cross-section of a semiconductor substrate on which an epitaxy has been carried out, according to the invention.

FIG. 4 is a transversal cross-section of a substrate 30 with a face 31 in silicon on which an epitaxy is to be performed. The substrate 30 can be a solid substrate or an SOI substrate.

On face 31, at least one initial guide mark 32 is produced. This initial guide mark is obtained by deposit and engraving of a stack of several layers. This guide mark makes it possible to cause certain defects during epitaxy, these defects being intended to be transferred and to be visible on the surface. The stack comprises successively, on the face 31 and after engraving, a layer of silicon oxide 33, a layer of silicon nitride 34 and a layer of polycrystalline silicon 35. The stack may only consist of a single. layer of dielectric material (in oxide or nitride form). The different layers can have the following thicknesses: about 100 nm for silicon oxide, around 500 nm for silicon nitride, and about 100 nm for polycrystalline silicon.

Since the epitaxied silicon 36 is monocrystalline, the geometry of the guide mark 32 is aligned with the crystallographic axes of the silicon of face 31. As an example, the guide mark 32 is aligned in the <110> direction for silicon shown by the orientation face 31 (100).

During epitaxy, the edges of the guide mark will create growth defects that propagate along the <111> plane as far as the surface of the epitaxied material. These planes are inclined at an angle α of 54.7° for silicon (100) and will therefore provoke the enlargement of the initial guide mark 32 while still remaining perfectly aligned with the latter. The final design will thus be widened on each side of the initial guide mark by a distance W such that:

$$W = \frac{e}{tg\alpha}$$

e being the thickness of the epitaxied layer.

Figure 5:
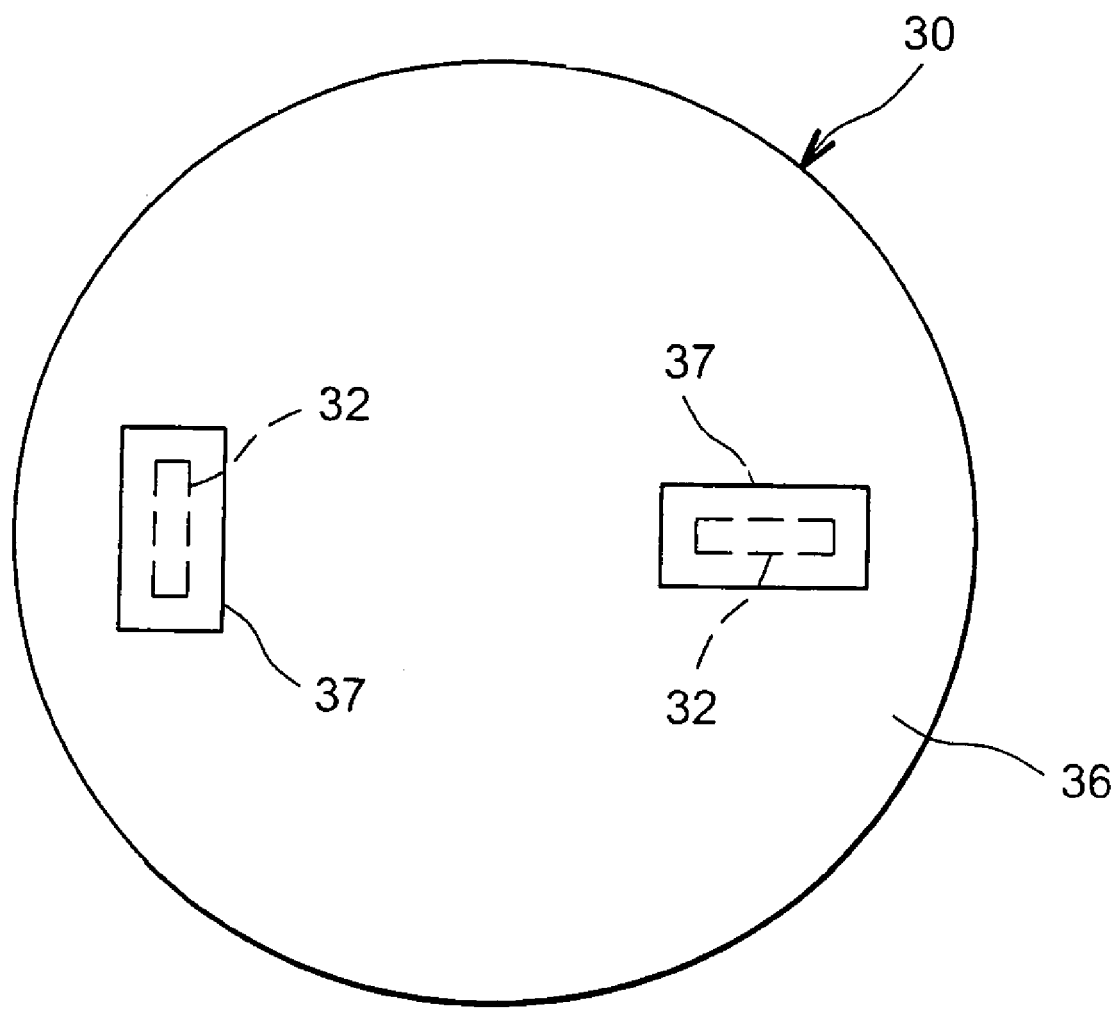
FIG. 5 shows a view from above of a semiconductor substrate on which an epitaxy has been carried out according to the invention.

A transferred guide mark 37 is obtained, whose surface is an enlarged reproduction of the surface of the initial guide mark 32. FIG. 5 is a view from above of the substrate 30 on which a silicon epitaxy 36 has been carried out. It shows two possible directions for the guide marks.

The inventors of the present invention have noted that the layer of polycrystalline silicon 35 of the initial guide mark 32 made it possible to obtain good quality epitaxy above the guide mark with low roughness. After the epitaxy stage, the transferred guide mark 37 is of very high quality and is very well aligned and perfectly readable by standard photolithographic equipment (steppers).

The invention claimed is:

1. A method enabling realignment between levels after a stage of epitaxy on a face of a substrate, comprising the production of at least one initial guide mark on said substrate face, the initial guide mark being designed so as to be transferred, during epitaxy, onto a surface of the epitaxied layer, the initial guide mark being produced in such a manner that, during epitaxy, its edges create growth defects that propagate as far as the surface of the epitaxied layer to provide a transferred guide mark on the epitaxied layer reproducing a shape of the initial guide mark and in alignment with the initial guide mark, wherein the production of the initial guide mark includes the formation of a plate comprising a stack of at least one layer of material not allowing development of epitaxy, formed on the substrate face, and of a layer of material permitting development of epitaxy.

2. The method according to claim 1, wherein the plate is formed by stages of deposit and engraving of layers.

3. The method according to claim 1, wherein the layer of material not allowing development of epitaxy is a layer of dielectric material.

4. The method according to claim 1, wherein said face of the substrate is a face allowing epitaxy of a semiconductor material.

5. The method according to claim 1, wherein said face of the substrate is a semiconductor material.

6. The method according to claim 3, wherein said face of the substrate is in monocrystalline silicon, the layer of material of the initial guide mark allowing development of epitaxy being in polycrystalline silicon, the edges of the guide mark being aligned with the crystalline axes of the monocrystalline silicon of the substrate.

7. The method according to claim 6, wherein the formation of the plate comprises, for obtaining the material not allowing development of epitaxy, the formation of a layer of silicon oxide and/or the formation of a layer of silicon nitride.

8. A substrate intended for the production of an epitaxy on one of its faces, comprising at least one initial guide mark designed to obtain, after the epitaxy stage, a transferred guide mark on a surface of the epitaxied layer, the initial guide mark having edges able to create growth defects during epitaxy, which propagate as far as the surface of the epitaxied layer to provide, on the surface of the epitaxied layer, the transferred guide mark that reproduces a shape of the initial guide mark and is in alignment with the initial guide mark, wherein the initial guide mark comprises a stack including at least one layer of material not allowing development of epitaxy, formed on the substrate face, and a layer of epitaxial material.

9. The substrate according to claim 8, wherein the layer of material not allowing development of epitaxy is a layer of dielectric material.

10. The substrate according to claim 8, wherein said face of the substrate is a face allowing epitaxy of a semiconductor material.

11. The substrate according to claim 8, wherein said face of the substrate is a semiconductor material.

12. The substrate according to claim 8, wherein said face of the substrate is in monocrystalline silicon, the layer of epitaxial material of the initial guide mark being in polycrystalline silicon, the edges of the guide mark being aligned with the crystalline axes of the monocrystalline silicon of the substrate.

13. The substrate according to claim 12, wherein the layer of material not allowing development of epitaxy is a layer of silicon oxide or a layer of silicon nitride.

* * * * *